United States Patent
Lyons et al.

(10) Patent No.: US 6,878,961 B2
(45) Date of Patent: Apr. 12, 2005

(54) PHOTOSENSITIVE POLYMERIC MEMORY ELEMENTS

(75) Inventors: Christopher F. Lyons, Fremont, CA (US); Ramkumar Subramanian, Sunnyvale, CA (US); Mark S. Chang, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/951,370

(22) Filed: Sep. 28, 2004

(65) Prior Publication Data
US 2005/0045877 A1 Mar. 3, 2005

Related U.S. Application Data

(62) Division of application No. 10/405,272, filed on Apr. 2, 2003, now Pat. No. 6,825,060.

(51) Int. Cl.[7] .............................................. H01L 35/24
(52) U.S. Cl. ....................... 257/40; 257/642; 257/798; 257/E39.007; 257/E51.001; 257/E51.027
(58) Field of Search ........................... 257/40, 642, 798

(56) References Cited

U.S. PATENT DOCUMENTS

| | | |
|---|---|---|
| 4,663,270 A | 5/1987 | Potember et al. |
| 5,589,692 A | 12/1996 | Reed |
| 6,055,180 A | 4/2000 | Gudesen et al. |
| 6,190,841 B1 | 2/2001 | Kihara et al. |
| 6,208,553 B1 | 3/2001 | Gryko et al. |
| 6,212,093 B1 | 4/2001 | Lindsey |
| 6,272,038 B1 | 8/2001 | Clausen et al. |
| 6,314,019 B1 | 11/2001 | Kuckes et al. |
| 6,320,200 B1 | 11/2001 | Reed et al. |
| 6,324,091 B1 | 11/2001 | Gryko et al. |
| 6,348,700 B1 | 2/2002 | Ellenbogen et al. |
| 6,596,656 B2 | 7/2003 | Tanaka et al. |
| 6,746,971 B1 * | 6/2004 | Ngo et al. .................. 438/780 |
| 6,773,954 B1 * | 8/2004 | Subramanian et al. ........ 438/99 |
| 2003/0047533 A1 | 3/2003 | Reid et al. |
| 2003/0162128 A1 | 8/2003 | Song et al. |
| 2004/0084670 A1 | 5/2004 | Tripsas et al. |

\* cited by examiner

*Primary Examiner*—Andy Huynh
(74) *Attorney, Agent, or Firm*—Amin & Turocy, LLP

(57) ABSTRACT

A method of making organic memory cells made of two electrodes with a controllably conductive media between the two electrodes is disclosed. The controllably conductive media contains an organic semiconductor layer that contains a photosensitive compound. The organic semiconductor layer is formed into memory cells using patterning techniques.

20 Claims, 5 Drawing Sheets

PHOTOSENSITIVE POLYMERIC MEMORY ELEMENTS

This application is a DIV of Ser. No. 10/405,272 filed Apr. 2, 2003, now U.S. Pat. No. 6,825,060.

TECHNICAL FIELD

The present invention generally relates to organic memory elements containing a photosensitive compound and methods of making organic memory devices. In particular, the present invention relates to using an organic semiconductor material containing a photosensitive compound to pattern an organic semiconductor layer in organic memory devices.

BACKGROUND ART

The basic functions of a computer and memory devices include information processing and storage. In typical computer systems, these arithmetic, logic, and memory operations are performed by devices that are capable of reversibly switching between two states often referred to as "0" and "1." Such switching devices are fabricated from semiconductor devices that perform these various functions and are capable of switching between two states at high speed.

Electronic addressing or logic devices, for instance for storage or processing of data, are made with inorganic solid state technology, and particularly crystalline silicon devices. The metal oxide semiconductor field effect transistor (MOSFET) is one the main workhorses.

Much of the progress in making computers and memory devices faster, smaller and cheaper involves integration, squeezing ever more transistors and other electronic structures onto a postage-stamp-sized piece of silicon. A postage-stamp-sized piece of silicon may contain tens of millions of transistors, each transistor as small as a few hundred nanometers. However, silicon-based devices are approaching their fundamental physical size limits.

Inorganic solid state devices are generally encumbered with a complex architecture which leads to high cost and a loss of data storage density. The circuitry of volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as inorganic solid state device sizes decrease and integration increases, sensitivity to alignment tolerances increases making fabrication markedly more difficult. Formation of features at small minimum sizes does not imply that the minimum size can be used for fabrication of working circuits. It is necessary to have alignment tolerances which are much smaller than the small minimum size, for example, one quarter the minimum size.

Scaling inorganic solid state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely.

Applying a voltage across a semiconductor junction (in the reverse-bias direction) creates a depletion region around the junction. The width of the depletion region depends on the doping levels of the semiconductor. If the depletion region spreads to contact another depletion region, punch-through or uncontrolled current flow, may occur. Higher doping levels tend to minimize the separations required to prevent punch-through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversibly degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention is a simplified form as a prelude to the more detailed description that is presented later.

The present invention provides organic memory devices that possess one or more of the following: small size compared to inorganic memory devices, capability to store multiple bits of information, short resistance/impedance switch time, low operating voltages, low cost, high reliability, long life (thousands/millions of cycles), capable of three dimensional packing, associated low temperature processing, light weight, high density/integration, and extended memory retention.

One aspect of the present invention relates to an organic memory cell containing an organic semiconductor layer positioned to be addressed by two electrodes, the organic semiconductor layer containing an organic semiconductor material selected from a conjugated organic polymer, a conjugated organometallic polymer, a buckyball, and a carbon nanotube; and at least one photosensitive compound.

Another aspect of the present invention relates to a method of making an organic semiconductor layer for an organic memory cell involving forming an organic semiconductor layer, exposing a portion of the organic semiconductor layer to actinic radiation, and removing either exposed portions of the organic semiconductor layer or unexposed portions of the organic semiconductor layer, thereby patterning the organic semiconductor layer.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

The present invention involves organic memory cells made of two electrodes with a controllably conductive media between the two electrodes. The controllably conductive media contains an organic semiconductor layer and passive layer. The organic semiconductor layer is made using spin-on techniques or chemical vapor deposition techniques, which permits the formation of inexpensive, efficient, and high quality organic semiconductor layers. The present invention permits forming the organic semiconductor layer over the entire substrate (or a major portion thereof), and then patterning the organic semiconductor layer to correspond with the subsequently formed organic memory cells. Consequently, forming the organic semiconductor layer in vias or trenches that correspond with the subsequently formed organic memory cells is not required. Cost and complexity of fabrication are thus improved.

The organic memory cells may optionally contain additional layers, such as additional electrodes, charge retention layers, and/or chemically active layers. The impedance of the controllably conductive media changes when an external stimuli such as an applied electric field is imposed. A plurality of organic memory cells, which may be referred to as an array, form an organic memory device. In this connection, organic memory cells may form an organic memory devices and function in a manner analogous to metal oxide semiconductor field effect transistors (MOSFETs) in conventional semiconductor memory devices. However, there are advantages to using the organic memory cells instead of conventional MOSFETs in memory devices.

Figure 1:
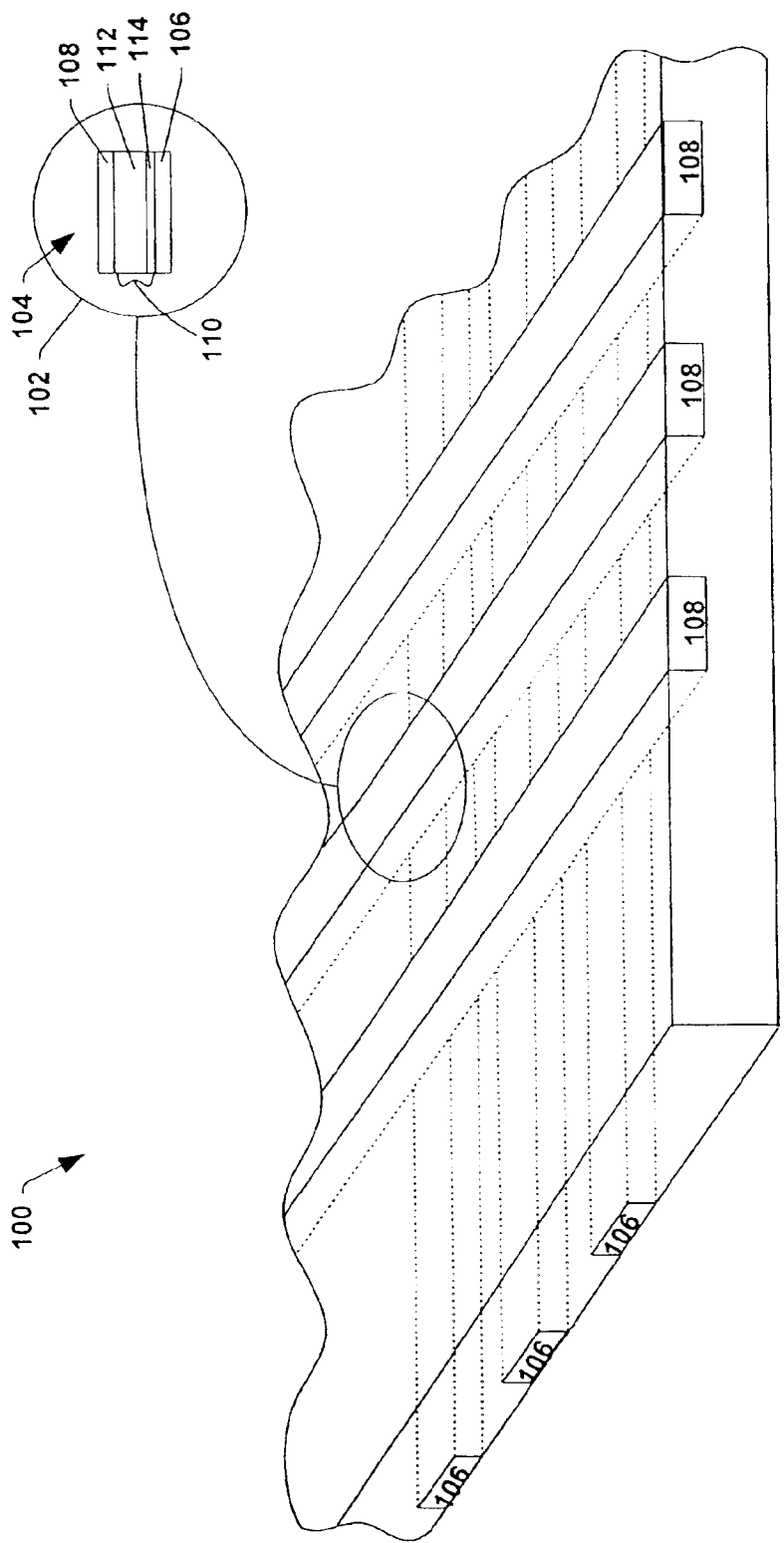
FIG. 1 illustrates a perspective view of a two dimensional microelectronic device containing a plurality of organic memory cells in accordance with one aspect of the invention.

Referring to FIG. 1, a brief description of a microelectronic organic memory device 100 containing a plurality of organic memory cells in accordance with one aspect of the invention is shown, as well as an exploded view 102 of an exemplary organic memory cell 104. The microelectronic organic memory device 100 contains a desired number of organic memory cells, as determined by the number of rows, columns, and layers (three dimensional orientation described later) present. The first electrodes 106 and the second electrodes 108 are shown in substantially perpendicular orientation, although other orientations are possible to achieve the structure of the exploded view 102. Each organic memory cell 104 contains a first electrode 106 and a second electrode 108 with a controllably conductive media 110 therebetween. The controllably conductive media 110 contains an organic semiconductor layer 112 and passive layer 114. Peripheral circuitry and devices are not shown for brevity.

The organic memory cells contain at least two electrodes, as one or more electrodes may be disposed between the two electrodes that sandwich the controllably conductive media. The electrodes are made of conductive material, such as conductive metal, conductive metal alloys, conductive metal oxides, conductive polymer films, semiconductive materials, and the like.

Examples of electrodes include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys.

In one embodiment, the thickness of each electrode is independently about 0.01 $\mu$m or more and about 10 $\mu$m or less. In another embodiment, the thickness of each electrode is independently about 0.05 $\mu$m or more and about 5 $\mu$m or less. In yet another embodiment, the thickness of each electrode is independently about 0.1 $\mu$m or more and about 1 $\mu$m or less.

The controllably conductive media, disposed between the two electrodes, can be rendered conductive or non-conductive in a controllable manner using an external stimuli. Generally, in the absence of an external stimuli, the controllably conductive media is non-conductive or has a high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, and a semiconductive state.

The controllably conductive media can be rendered conductive, non-conductive or any state therebetween (degree of conductivity) in a controllable manner by an external stimulus (external meaning originating from outside the controllably conductive media). For example, under an external electric field, radiation, and the like, a given non-conductive controllably conductive media is converted to a conductive controllably conductive media.

The controllably conductive media contains one or more organic semiconductor layers and one or more passive layers. In one embodiment, the controllably conductive media contains at least one organic semiconductor layer that is adjacent a passive layer (without any intermediary layers between the organic semiconductor layer and passive layer).

The organic semiconductor layer contains an organic semiconductor material selected from at least one of an organic polymer (such as a conjugated organic polymer), an organometallic polymer (such as a conjugated organometallic polymer), a buckyball, a carbon nanotube (such as a C6–C60 carbon nanotubes), and the like. Organic semiconductors thus have a carbon based structure, often a carbon-hydrogen based structure, which is different from conventional MOSFETs. The organic semiconductor materials are typically characterized in that they have overlapping $\pi$ orbitals, and/or in that they have at least two stable oxidation states. The organic semiconductor materials are also characterized in that they may assume two or more resonant structures. The overlapping π orbitals contribute to the controllably conductive properties of the controllably conductive media. The amount of charge injected into the organic semiconductor layer also influences the degree of conductivity of the organic semiconductor layer.

A carbon nanotube is typically a hexagonal network of carbon atoms (from about 6 to about 60 carbon atoms, typically) that is rolled up into a seamless cylinder. Each end may be capped with half of a fullerene molecule. Carbon nanotubes may be prepared by the laser vaporization of a carbon target (a cobalt-nickel catalyst may facilitate growth) or a carbon-arc method to grow similar arrays of single-wall nanotubes. A buckyball is more specifically a buckminsterfullerene, a soccerball-shaped 60-atom cluster of pure carbon.

The organic polymer typically contains a conjugated organic polymer. The polymer backbone of the conjugated organic polymer extends lengthwise between the electrodes (generally substantially perpendicular to the inner, facing surfaces of the electrodes). The conjugated organic polymer may be linear or branched, so long as the polymer retains its conjugated nature. Conjugated polymers are characterized in that they have overlapping π orbitals. Conjugated polymers are also characterized in that they may assume two or more resonant structures. The conjugated nature of the conjugated organic polymer contributes to the controllably conductive properties of the controllably conductive media.

In this connection, the organic semiconductor layer, such as the conjugated organic polymer, has the ability to donate and accept charges (holes and/or electrons). Generally, the organic semiconductor or an atom/moiety in the polymer has at least two relatively stable oxidation states. The two relatively stable oxidation states permit the organic semiconductor to donate and accept charges and electrically interact with the conductivity facilitating compound. The ability of the organic semiconductor layer to donate and accept charges and electrically interact with the passive layer also depends on the identity of the conductivity facilitating compound.

The organic polymers (or the organic monomers constituting the organic polymers) may be cyclic or acyclic. Examples of conjugated organic polymers include one or more of polyacetylene; polyphenylacetylene; polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like.

Chemical structures of examples of repeating units/moieties that make up the conjugated organic polymers and conjugated organometallic polymers include one or more of Formulae (I) to (XIII):

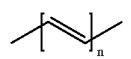
(I)

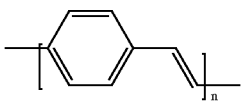
(II)

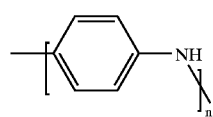
(III)

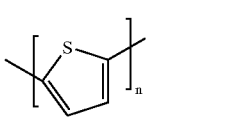
(IV)

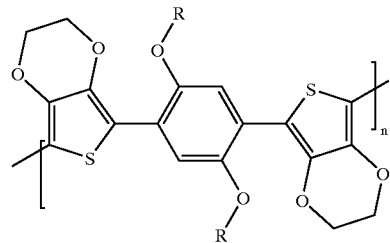
(V)

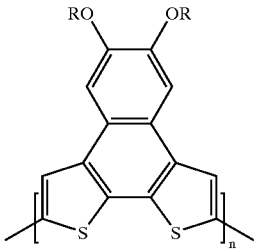
(VI)

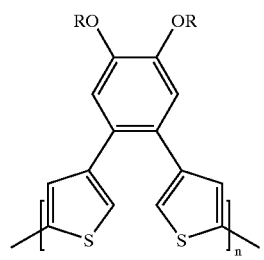
(VII)

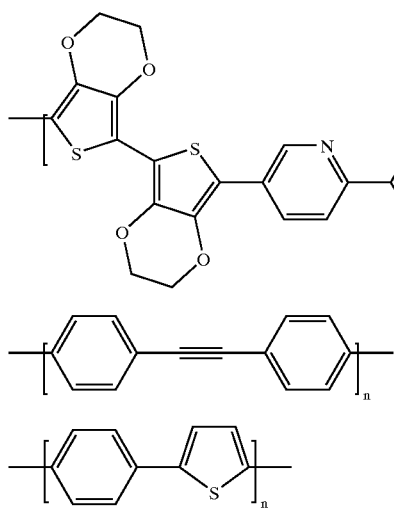

(VIII)

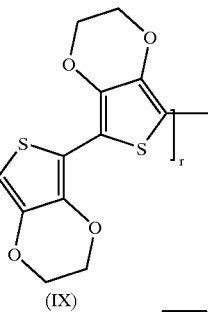

(IX)

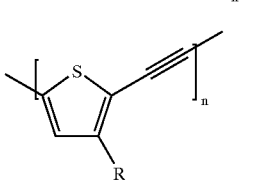

(X)

(XI)

(XII)

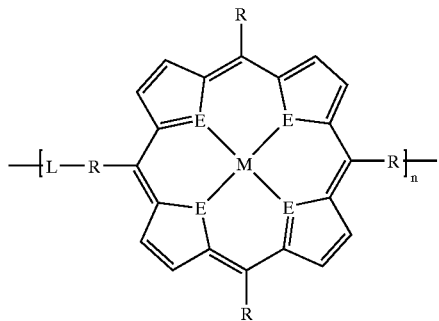

(XIII)

wherein each R is independently hydrogen or hydrocarbyl; each M is independently a metal; each E is independently O, N, S, Se, Te, or CH; each L is independently a group containing or continuing conjugation (unsaturation); and each n is independently about 1 or more and about 25,000 or less. In another embodiment, each n is independently about 2 or more and about 10,000 or less. In yet another embodiment, each n is independently about 20 or more and about 5,000 or less. Examples of metals include Ag, Al, Au, B, Cd, Co, Cu, Fe, Ga, Hg, Ir, Mg, Mn, Ni, Pb, Pd, Pt, Rh, Sn, and Zn. Examples of L groups include hydrocarbyl groups possessing conjugation or the ability to form resonance structures, such as phenyl groups, substituted phenyl groups, acetylene groups, and the like.

Any of the formulae may have one or more pendent substituent groups, not shown in the formulae. For example, a phenyl group may appear on the polythiophene structure, such as on the 3 position of each thiophene moiety. As another example, alkyl, alkoxy, cyano, amino, and/or hydroxy substituent groups may be present on the phenyl rings in any of the polyphenylacetylene, polydiphenylacetylene, and poly(p-phenylene vinylene) conjugated polymers. Alternatively, any of the formulae may have one or more acid labile pendent substituent groups (described further in detail below).

The term "hydrocarbyl" includes hydrocarbon as well as substantially hydrocarbon groups. Hydrocarbyl groups contain 1 or more carbon atom and typically about 60 or less carbon atoms. In another embodiment, hydrocarbyl groups contain 2 or more carbon atoms and about 30 or less carbon atoms. Substantially hydrocarbon describes groups which contain heteroatom substituents or heteroatoms which do not alter the predominantly organic character of the polymer, and do not impede the ability of the organic polymer to form a conjugated structure. Examples of hydrocarbyl groups include the following:

(1) hydrocarbon substituents, i.e., aliphatic (e.g., alkyl or alkenyl), alicyclic (e.g., cycloalkyl, cycloalkenyl) substituents, acyl, phenyl, aromatic-, aliphatic- and alicyclic-substituted aromatic substituents and the like as well as cyclic substituents wherein the ring is completed through another portion of the molecule (that is, for example, any two indicated substituents may together form an alicyclic radical);

(2) substituted hydrocarbon substituents, i.e., those substituents containing non-hydrocarbon groups which, in the context of this invention, do not alter the predominantly organic nature of the substituent; those skilled in the art will be aware of such groups (e.g., halo (especially chloro and fluoro, such as perfluoroalkyl, perfluoroaryl), cyano, thiocyanato, amino, alkylamino, sulfonyl, hydroxy, mercapto, nitro, nitroso, sulfoxy, etc.);

(3) heteroatom substituents, i.e., substituents which, while having a predominantly organic character within the context of this invention, contain an atom other than carbon present in a ring or chain otherwise composed of carbon atoms (e.g., alkoxy, alkylthio). Suitable heteroatoms will be apparent to those of ordinary skill in the art and include, for example, sulfur, oxygen, nitrogen, fluorine, chlorine, and such substituents as, e.g., pyridyl, furyl, thienyl, imidazolyl, imido, amido, carbamoyl, etc.

The organic semiconductor material layer contains a photosensitive compound that undergoes a chemical change upon exposure to actinic radiation (light or heat). Typically, the photosensitive compound is a photosensitive acid (photoacid) generator. The presence of the photosensitive compound in the organic semiconductor material permits patterning of the organic semiconductor material layer. Since the organic semiconductor material can be patterned, it is not necessary to form vias, trenches, or other openings in which to form the organic semiconductor material. Consequently, the organic semiconductor material can be formed over large portions or the entire substrate. Dielectric material can be formed around the organic semiconductor material after it is patterned. This eliminates the need to form openings in a dielectric material.

The organic semiconductor material layer contains a suitable amount of at least one photosensitive compound to provide a solubility difference in exposed and unexposed portions of the organic semiconductor material layer (after imagewise exposure to actinic radiation) to facilitate patterning of the imagewise exposed organic semiconductor material layer. In one embodiment, the organic semiconductor material contains from about 75% to about 99.99% by weight of an organic semiconductor material and from about 0.01% to about 25% by weight of at least one photosensitive compound. In another embodiment, the organic semiconductor material contains from about 85% to about 99.9% by weight of an organic semiconductor material and from about 0.1% to about 15% by weight of at least one photosensitive compound. In yet another embodiment, the organic semiconductor material contains from about 90% to about 99.5% by weight of an organic semiconductor material and from about 0.5% to about 10% by weight of at least one photosensitive compound.

The organic semiconductor material may contain material or a side chain/pendent group that is reactive with the radiation induced changed photosensitive compound, and/or a product of the radiation induced change, such as a proton in the case of a photoacid generator. Or the organic semiconductor material changes its solubility in certain solvents due to the new presence of a proton.

Specifically, upon imagewise exposure to radiation or heat, the photoacid generator produces a proton. The proton causes chemical changes within the organic semiconductor material so that the exposed portions of the organic semiconductor material are soluble in a solvent while the unexposed portions of the organic semiconductor material are not soluble in the solvent. For example, exposed portions of the organic semiconductor material may be soluble in polar developers while the unexposed portions of the organic semiconductor material are not soluble in polar developers. Alternatively, exposed portions of the organic semiconductor material may be soluble in nonpolar developers while the unexposed portions of the organic semiconductor material are not soluble in nonpolar developers.

Instead of the mere presence of a proton changing solvent solubility, an acid labile pendent group attached to the organic semiconductor polymer may change the solubility compared to unexposed portions of the organic semiconductor material. For example, acid labile pendent groups include alkyl esters of carboxylic acids and alkyl carbonates of phenols, including trityl, benzyl, benzyhdryl modifications thereof.

In another embodiment, examples of the acid labile group include alkoxy groups such as tert-butoxy and alkoxyphenyl groups; tert-butyl methacrylate, carbonate groups such as tert-butoxycarbonyloxy; tertiary carboxylate groups; trialkylsilyloxy groups; and acetal and ketal groups such as tetrahydrofuranyloxy, tetrahydropyranyloxy, 2-methoxytetra-hydropyranyloxy, methoxymethyloxy, 1-ethoxyethoxy, 1-propoxyethoxy, 1-n-butoxyethoxy, 1-isobutoxyethoxy, 1-sec-butoxyethoxy, 1-tert-butoxyethoxy, 1-amyloxyethoxy, 1-ethoxy-1-methylethoxy, 1-propoxy-1-methylethoxy, 1-n-butoxy-1-methylethoxy, 1-isobutoxy-1-methylethoxy, 1-sec-butoxy-1-methylethoxy, 1-tert-butoxy-1-methylethoxy, and 1-amyloxy-1-methylethoxy groups.

The photosensitive compound may be chosen from a wide variety of compounds known to form acid upon exposure to activating radiation. These photoacid generators form an acid in response to heat and/or radiation of different wavelengths ranging from visible to X-ray. In one general embodiment, photosensitive compounds or photoacid generating compounds include aromatic substituted halohydrocarbons (such as 1,1-bis(p-chlorophenyl)-2,2,2-trichloroethane), halo-substituted sulfur containing compounds, haloheterocyclic compounds, onium salts (such as diaryl diazonium salts), azides, triazines, sulfonated esters, and sulfonated ketones.

In one embodiment, the photosensitive compounds or photoacid generator is one or more unsubstituted and symmetrically or unsymmetrically substituted diaryliodonium, aryldiazonium, triarylselenonium, triarylsulfonium salts, a nitrobenzyl ester, or an s-triazine derivative.

In one embodiment, the photosensitive compounds or photoacid generator is an o-quinone diazide sulfonic acid ester including 2,1,4-diazonaphthoquinone sulfonic acid esters and the 2,1,5-diazonaphthoquinone sulfonic acid esters. In another embodiment, the photoacid generator is a sulfonated ester including sulfonyloxy ketones. Examples include benzoin tosylate, t-butylphenyl alpha-(p-toluenesulfonyloxy)-acetate, and t-butyl alpha-(p-toluenesulfonyloxy)-acetate.

In yet another embodiment, the photosensitive compounds or photoacid generator is an onium salt. Examples of suitable onium salts are diaryldiazonium salts and onium salts of Group Va and B. Ia and B and I of the Periodic Table, for example, halonium salts, quaternary ammonium, phosphonium and arsonium salts, aromatic sulfonium salts, aryl sulfonium salts, alkyl sulfonium salts, and sulfoxonium salts or seleonium salts.

In still yet another embodiment, the photosensitive compounds or photoacid generator includes triaryl sulfonium hexafluoroantimonate, diaryliodonium metal halides, and certain non-ionic acid generators such as tris(sulfonate) of pyrogallol, and N-sulfonyloxynaphthalimides. In this embodiment, specific examples include triphenylsulfonium triflate and N-sulfonyloxynaphthalimide generators such as N-camphorsulfonyloxynaphthalimide and N-pentafluorobenzenesulfonyloxnaphthalimide.

In yet another embodiment, the photosensitive compound or photoacid generator includes halogenated non-ionic, photoacid generating compounds such as, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclododecane; 1,10-dibromodecane; 1,1-bis[p-chloropehnyl]-2,2-dichloroethane; 4,4'-dichloro-2-(trichloromethyl) benzhydrol (Kelthane); hexachlorodimethyl sulfone; 2-chloro-6-(trichloromethyl) pyridine; 0,0-diethyl-0-(3,5,6-trichloro-2-pyridyl) phosphorothionate; 1,2,3,4,5,6-hexachlorocyclohexane; N(1,1-bis[p-chlorophenyl]-2,2,2-trichloroethyl)acetamide; tris[2,3-dibromopropyl]isocyanurate; 2,2-bis[p- chlorophenyl]-1,1-dichloroethylene; tris[trichloromethyl]-s-triazine; and their isomers, analogs, homologs, and residual compounds.

In yet another embodiment, the photosensitive compound or photoacid generator includes sulfonium salts. Examples of sulfonium salts include tris(4-dimethylaminophenyl)sulfonium p-toluenesulfonate; bis(4-tert-butoxyphenyl)(4-dimethylaminophenyl)sulfonium p-toluenesulfonate; (4-tert-butoxyphenyl)bis(4-dimethylaminophenyl)sulfonium p-toluenesulfonate; bis(4-tert-butoxycarbonylmethyloxyphenyl)(4-dimethylaminophenyl)sulfonium p-toluenesulfonate; (4-tert-butoxycarbonylmethyloxyphenyl)bis(4-dimethylaminophenyl)sulfonium p-toluenesulfonate; bis(4-(1-ethoxyethyloxy)phenyl)4-dimethylaminophenyl)-sulfonium p-toluenesulfonate; (4-(1-ethoxyethyloxy)phenyl)bis(4-dimethylaminophenyl)-sulfonium p-toluenesulfonate; bis(4-tetrahydropyranyloxyphenyl)(4-dimethylaminophenyl)-sulfonium p-toluenesulfonate; (4-tetrahydrofuranyloxyphenyl)bis(4-dimethylaminophenyl)-sulfonium p-toluenesulfonate; tris(4-dimethylaminophenyl)sulfonium p-ethylbenzenesulfonate; bis((4-tert-butoxyphenyl)(4-dimethylaminophenyl)sulfonium p-ethylbenzenesulfonate; (4-tert-butoxyphenyl)bis(4-dimethylaminophenyl)sulfonium p-ethylbenzenesulfonate; tris(4-dimethylaminophenyl)sulfonium 2,4-dimethylbenzenesulfonate; bis(4-tert-butoxyphenyl)(4-dimethylaminophenyl)sulfonium 2,4-dimethylbenzenesulfonate; (4-tert-butoxyphenyl)bis(4-dimethylaminophenyl)sulfonium 2,4-dimethylbenzenesulfonate; (4-tert-butoxyphenyl)bis(4-dimethylaminophenyl)sulfonium p-tert-butylbenzenesulfonate; bis(4-tert-butoxycarbonylmethyloxyphenyl)(4-dimethylaminophenyl)sulfonium 2,5-dimethylbenzenesulfonate; (4-tert-butoxycarbonylmethyloxyphenyl)bis(4-dimethylaminophenyl)sulfonium n-octylbenzenesulfonate; tris(4-dimethylaminophenyl)sulfonium p-tert-butylbenzenesulfonate; bis(4-tert-butoxyphenyl)(4-dimethylaminophenyl)sulfonium p-tert-butylbenzenesulfonate; (4-tert-butoxyphenyl)bis(4-dimethylaminophenyl)sulfonium benzenesulfonate; bis(4-tert-butoxycarbonylmethyloxyphenyl)(4-dimethylaminophenyl)sulfonium benzenesulfonate; (4-tert-butoxycarbonylmethyloxyphenyl)bis(4-dimethylaminophenyl)sulfonium benzenesulfonate; tris(3-dimethylaminophenyl)sulfonium p-toluenesulfonate; bis(4-tert-butoxyphenyl)(3-dimethylaminophenyl)sulfonium p-toluenesulfonate; (4-tert-butoxyphenyl)bis(3-dimethylaminophenyl)sulfonium p-toluenesulfonate; bis(4-tert-butoxycarbonylmethyloxyphenyl)(3-dimethylaminophenyl)sulfonium p-toluenesulfonate; (4-tert-butoxycarbonylmethyloxyphenyl)bis(3-dimethylamino-phenyl)sulfonium p-toluenesulfonate; bis(4-(1-ethoxyethyloxy)phenyl)(3-dimethylaminophenyl)-sulfonium p-toluenesulfonate; (4-(1-ethoxyethyloxy)phenyl)bis(3-dimethylaminophenyl)-sulfonium p-toluenesulfonate; bis(4-tetrahydropyranyloxyphenyl)(3-dimethylaminophenyl)-sulfonium p-toluenesulfonate; (4-tetrahydrofuranyloxyphenyl)bis(3-dimethylaminophenyl)sulfonium p-toluenesulfonate; tris(3-dimethylaminophenyl)sulfonium p-ethylbenzenesulfonate; bis(4-tert-butoxyphenyl)(3-dimethylaminophenyl)sulfonium 2,4-dimethylbenzenesulfonate; (4-tert-butoxycarbonylmethyloxyphenyl)bis(3-dimethylamino-phenyl)sulfonium n-octylbenzenesulfonate; bis(4-tert-butoxyphenyl)(3-dimethylaminophenyl)sulfonium benzenesulfonate; (4-tert-butoxyphenyl)bis(3-dimethylaminophenyl)sulfonium p-tert-butylbenzenesulfonate; bis(4-tert-butoxycarbonylmethyloxyphenyl)(3-dimethylaminophenyl)sulfonium benzenesulfonate, (4-tert-butoxycarbonylmethyloxyphenyl)bis(3-dimethylaminophenyl)sulfonium benzenesulfonate; tris(4-(2-picolyloxy)phenyl)sulfonium p-toluenesulfonate; bis(4-tert-butoxyphenyl)(4-(2-picolyloxy)phenyl)sulfonium p-toluenesulfonate; (4-tert-butoxyphenyl)bis(4-(2-picolyloxy)phenyl)sulfonium p-toluenesulfonate; bis(4-tert-butoxycarbonylmethyloxyphenyl)(4-(2-picolyloxy)phenyl)sulfonium p-toluenesulfonate; (4-tert-butoxycarbonylmethyloxyphenyl)bis(4-(2-picolyloxy)phenyl)sulfonium p-toluenesulfonate; bis(4-(1-ethoxyethyloxy)phenyl)(4-(2-picolyloxy)phenyl)-sulfonium p-toluenesulfonate; (4-(1-ethoxyethyloxy)phenyl)bis(4-(2-picolyloxy)phenyl)-sulfonium p-toluenesulfonate; bis(4-tetrahydropyranyloxyphenyl)(4-(2-picolyloxy)phenyl)-sulfonium p-toluenesulfonate; (4-tetrahydrofuranyloxyphenyl)bis(4-(2-picolyloxy)phenyl)-sulfonium p-toluenesulfonate; tris(4-(2-picolyloxy)phenyl)sulfonium p-ethylbenzene-sulfonate; tris(4-(2-picolyloxy)phenyl)sulfonium 2,4-dimethylbenzenesulfonate; bis(4-tert-butoxyphenyl)(4-(2-picolyloxy)phenyl)sulfonium 2,4-dimethylbenzenesulfonate; (4-tert-butoxyphenyl)bis(4-(2-picolyloxy)phenyl)sulfonium 2,4-dimethylbenzenesulfonate; (4-tert-butoxyphenyl)bis(4-(2-picolyloxy)phenyl)sulfonium p-tert-butylbenzenesulfonate; bis(4-tert-butoxycarbonylmethyloxyphenyl)(4-(2-picolyloxy)phenyl)sulfonium 2,5-dimethylbenzenesulfonate; (4-tert-butoxycarbonylmethyloxyphenyl)bis(4-(2-picolyloxy)phenyl)sulfonium n-octylbenzenesulfonate; tris(4-(2-picolyloxy)phenyl)sulfonium p-tert-butylbenzene-sulfonate; bis(4-tert-butoxyphenyl)(4-(2-picolyloxy)phenyl)sulfonium benzenesulfonate; (4-tert-butoxyphenyl)bis(4-(2-picolyloxy)phenyl)sulfonium benzenesulfonate; bis(4-tert-butoxycarbonylmethyloxyphenyl)(4-(2-picolyloxy)phenyl)sulfonium benzenesulfonate; (4-tert-butoxycarbonylmethyloxyphenyl)bis(4-(2-picolyloxy)phenyl)sulfonium benzenesulfonate; tris(4-(4-picolyloxy)phenyl)sulfonium p-toluenesulfonate; bis(4-tert-butoxyphenyl)(4-(4-picolyloxy)phenyl)sulfonium p-toluenesulfonate; (4-tert-butoxyphenyl)bis(4-(4-picolyloxy)phenyl)sulfonium p-toluenesulfonate; bis(4-tert-butoxycarbonylmethyloxyphenyl)(4-(4-picolyloxy)phenyl)sulfonium p-toluenesulfonate; (4-tert-butoxycarbonylmethyloxyphenyl)bis(4-(4-picolyloxy)-phenyl)sulfonium p-toluenesulfonate; bis(4-(1-ethoxyethyloxy)phenyl)(4-(4-picolyloxy)phenyl)-sulfonium p-toluenesulfonate; (4-(1-ethoxyethyloxy)phenyl)bis(4-(4-picolyloxy)phenyl)-sulfonium p-toluenesulfonate; bis(4-tetrahydropyranyloxyphenyl)(4-(4-picolyloxy)phenyl)-sulfonium p-toluenesulfonate; (4-tetrahydrofuranyloxyphenyl)bis(4-(4-picolyloxy)phenyl)-sulfonium p-toluenesulfonate; tris(4-(4-picolyloxy)phenyl)sulfonium p-ethylbenzenesulfonate; tris(4-(4-picolyloxy)phenyl)sulfonium 2,4-dimethylbenzene-sulfonate; bis(4-tert-butoxyphenyl)(4-(4-picolyloxy)phenyl)sulfonium 2,4-dimethylbenzenesulfonate; (4-tert-butoxyphenyl)bis(4-(4-picolyloxy)phenyl)sulfonium 2,4-dimethylbenzenesulfonate; (4-tert-butoxycarbonylmethyloxyphenyl)bis(4-(4-picolyloxy)-phenyl)sulfonium 2,4-dimethylbenzenesulfonate; bis(4-tert-butoxyphenyl)(4-(4-picolyloxy)phenyl)sulfonium p-tertbutylbenzenesulfonate; (4-tert-butoxyphenyl)bis(4-(4-picolyloxy)phenyl)sulfonium p-tert-butylbenzenesulfonate; bis(4-tert-butoxycarbonylmethyloxyphenyl)(4-(4-picolyloxy)-phenyl)sulfonium 2,5-dimethylbenzenesulfonate; (4-tert-butoxycarbonylmethyloxyphenyl)bis(4-(4-picolyloxy)-phenyl)sulfonium n-octylbenzenesulfonate; tris(4-(4-picolyloxy)phenyl)sulfonium p-tert-butylbenzenesulfonate; bis(4-tert-butoxyphenyl)(4-(4-picolyloxy)phenyl)sulfonium benzenesulfonate; (4-tert-butoxyphenyl)bis(4-(4-picolyloxy)phenyl)sulfonium p-tert-butylbenzenesulfonate; bis(4-tert-butoxycarbonylmethyloxyphenyl)(4-(4-picolyloxy)-phenyl)sulfonium benzenesulfonate; (4-tert-butoxycarbonylmethyloxyphenyl)bis(4-(4-picolyloxy)-phenyl)sulfonium benzenesulfonate; tris(3-(4-picolyloxy)phenyl)sulfonium p-toluenesulfonate; bis(4-tert-butoxyphenyl)(3-(4-picolyloxy)phenyl)sulfonium p-toluenesulfonate; (4-tert-butoxyphenyl)bis(3-(4-picolyloxy)phenyl)sulfonium p-toluenesulfonate; bis(4-tert-butoxycarbonylmethyloxyphenyl)(3-(4-picolyloxy)phenyl)sulfonium p-toluenesulfonate; (4-tert-butoxycarbonylmethyloxyphenyl)bis(3-(4-picolyloxy)-phenyl)sulfonium p-toluenesulfonate; bis(4-(1-ethoxyethyloxy)phenyl)(3-(4-picolyloxy)phenyl)-sulfonium p-toluenesulfonate; (4-(1-ethoxyethyloxy)phenyl)bis(3-(4-picolyloxy)phenyl)-sulfonium p-toluenesulfonate; bis(4-tetrahydropyranyloxyphenyl)(3-(4-picolyloxy)phenyl)-sulfonium p-toluenesulfonate; (4-tetrahydrofuranyloxyphenyl)bis(3-(4-picolyloxy)phenyl)-sulfonium p-toluenesulfonate; tris(3-(4-picolyloxy)phenyl)sulfonium p-ethylbenzene-sulfonate; tris(3-(4-picolyloxy)phenyl)sulfonium 2,4-dimethylbenzene-sulfonate; bis(4-tert-butoxyphenyl)(3-(4-picolyloxy)phenyl)sulfonium 2,4-dimethylbenzenesulfonate; (4-tert-butoxyphenyl)bis(3-(4-picolyloxy)phenyl)sulfonium 2,4-dimethylbenzenesulfonate; bis(4-tert-butoxycarbonylmethyloxyphenyl)(3-(4-picolyloxy)-phenyl)sulfonium 2,4-dimethylbenzenesulfonate; (4-tert-butoxycarbonylmethyloxyphenyl)bis(3-(4-picolyloxy)-phenyl)sulfonium 2,4-dimethylbenzenesulfonate; (4-tert-butoxycarbonylmethyloxyphenyl)bis(3-(4-picolyloxy)-phenyl)sulfonium n-octylbenzenesulfonate; tris(3-(4-picolyloxy)phenyl)sulfonium benzenesulfonate; bis(4-tert-butoxyphenyl)(3-(4-picolyloxy)phenyl)sulfonium benzenesulfonate; (4-tert-butoxycarbonylmethyloxyphenyl)bis(3-(4-picolyloxy)phenyl)sulfonium benzenesulfonate; tris(3-(2-picolyloxy)phenyl)sulfonium p-toluenesulfonate; bis(4-tert-butoxyphenyl)(3-(2-picolyloxy)phenyl)sulfonium p-toluenesulfonate; (4-tert-butoxyphenyl)bis(3-(2-picolyloxy)phenyl)sulfonium p-toluenesulfonate; bis(4-tert-butoxycarbonylmethyloxyphenyl)(3-(2-picolyloxy)-phenyl)sulfonium p-toluenesulfonate; (4-tert-butoxycarbonylmethyloxyphenyl)bis(3-(2-picolyloxy)-phenyl)sulfonium p-toluenesulfonate; bis(4-(1-ethoxyethyloxy)phenyl)(3-(2-picolyloxy)phenyl)-sulfonium p-toluenesulfonate; (4-(1-ethoxyethyloxy)phenyl)bis(3-(2-picolyloxy)phenyl)-sulfonium p-toluenesulfonate; bis(4-tetrahydropyranyloxyphenyl)(3-(2-picolyloxy)phenyl)-sulfonium p-toluenesulfonate; (4-tetrahydrofuranyloxyphenyl)bis(3-(2-picolyloxy)phenyl)-sulfonium p-toluenesulfonate; tris(3-(2-picolyloxy)phenyl)sulfonium p-ethylbenzene-sulfonate; tris(3-(2-picolyloxy)phenyl)sulfonium 2,4-dimethylbenzene-sulfonate; bis(4-tert-butoxyphenyl)(3-(2-picolyloxy)phenyl)sulfonium 2,4-dimethylbenzenesulfonate; (4-tert-butoxycarbonylmethyloxyphenyl)bis(3-(2-picolyloxy)-phenyl)sulfonium 2,4-dimethylbenzenesulfonate; (3-tert-butoxycarbonylmethyloxyphenyl)bis(3-(2-picolyloxy)-phenyl)sulfonium 2,4-dimethylbenzenesulfonate; (3-tert-butoxyphenyl)bis(3-(2-picolyloxy)phenyl)sulfonium p-tert-butylbenzenesulfonate; bis(4-tert-butoxycarbonylmethyloxyphenyl)(3-(2-picolyloxy)-phenyl)sulfonium 4-tert-butylbenzenesulfonate; (4-tert-butoxycarbonylmethyloxyphenyl)bis(3-(2-picolyloxy)phenyl)sulfonium n-octylbenzenesulfonate; tris(3-(2-picolyloxy)phenyl)sulfonium benzenesulfonate; bis(4-tert-butoxyphenyl)(3-(2-picolyloxy)phenyl)sulfonium benzenesulfonate; (4-tert-butoxycarbonylmethyloxyphenyl)bis(3-(2-picolyloxy)phenyl)sulfonium benzenesulfonate; tris(pyridin-3-yl)sulfonium p-toluenesulfonate; bis(4-tert-butoxyphenyl)(pyridin-3-yl)sulfonium p-toluenesulfonate; (4-tert-butoxyphenyl)bis(pyridin-3-yl)sulfonium p-toluenesulfonate; bis(4-tert-butoxycarbonylmethyloxyphenyl)(pyridin-3-yl)-sulfonium p-toluenesulfonate; (4-tert-butoxycarbonylmethyloxyphenyl)bis(pyridin-3-yl)-sulfonium p-toluenesulfonate; bis(4-(1-ethoxyethyloxy)phenyl)(pyridin-3-yl)sulfonium p-toluenesulfonate; (4-(1-ethoxyethyloxy)phenyl)bis(pyridin-3-yl)sulfonium p-toluenesulfonate; bis(4-tetrahydropyranyloxyphenyl)(pyridin-3-yl)sulfonium p-toluenesulfonate; (4-tetrahydrofuranyloxyphenyl)bis(pyridin-3-yl)sulfonium p-toluenesulfonate; tris(pyridin-3-yl)sulfonium p-ethylbenzenesulfonate; tris(pyridin-3-yl)sulfonium 2,4-dimethylbenzenesulfonate; bis(4-tert-butoxyphenyl)(pyridin-3-yl)sulfonium 2,4-dimethyl-benzenesulfonate; (4-tert-butoxycarbonylmethyloxyphenyl)bis(pyridin-3-yl)sulfonium 2,4-dimethylbenzenesulfonate; (4-tert-butoxyphenyl)bis(pyridin-3-yl)sulfonium p-tert-butylbenzenesulfonate; (4-tert-butoxycarbonylmethyloxyphenyl)bis(pyridin-3-yl)-sulfonium n-octylbenzenesulfonate; tris(pyridin-3-yl)sulfonium benzenesulfonate; bis(4-tert-butoxyphenyl)(pyridin-3-yl)sulfonium benzenesulfonate; (4-tert-butoxycarbonylmethyloxyphenyl)bis(pyridin-3-yl)-sulfonium benzenesulfonate; tris(pyridin-2-yl)sulfonium p-toluenesulfonate; bis(4-tert-butoxyphenyl)(pyridin-2-yl)sulfonium p-toluenesulfonate; (4-tert-butoxyphenyl)bis(pyridin-2-yl)sulfonium p-toluenesulfonate; bis(4-tert-butoxycarbonylmethyloxyphenyl)(pyridin-2-yl)-sulfonium p-toluenesulfonate; (4-tert-butoxycarbonylmethyloxyphenyl)bis(pyridin-2-yl)-sulfonium p-toluenesulfonate; bis(4-(1-ethoxyethyloxy)phenyl)(pyridin-2-yl)sulfonium p-toluenesulfonate; (4-(1-ethoxyethyloxy)phenyl)bis(pyridin-2-yl)sulfonium p-toluenesulfonate; bis(4-tetrahydropyranyloxyphenyl)(pyridin-2-yl)sulfonium p-toluenesulfonate; (4-tetrahydrofuranyloxyphenyl)bis(pyridin-2-yl)sulfonium p-toluenesulfonate; tris(pyridin-2-yl)sulfonium p-ethylbenzenesulfonate; tris(pyridin-2-yl)sulfonium 2,4-dimethylbenzenesulfonate; bis(4-tert-butoxyphenyl)(pyridin-2-yl)sulfonium 2,4-dimethylbenzenesulfonate; (4-tert-butoxyphenyl)bis(pyridin-2-yl)sulfonium 2,4-dimethylbenzenesulfonate; bis(3-tert-butoxycarbonylmethyloxyphenyl)(pyridin-2-yl)-sulfonium 2,4-dimethylbenzenesulfonate; (4-tert-butoxycarbonylmethyloxyphenyl)bis(pyridin-2-yl)sulfonium 2,4-dimethylbenzenesulfonate; (4-tert-butoxyphenyl)bis(pyridin-2-yl)sulfonium p-tert-butylbenzenesulfonate; (4-tert-butoxycarbonylmethyloxyphenyl)bis(pyridin-2-yl)-sulfonium n-octylbenzenesulfonate; and tris(pyridin-2-yl)sulfonium benzenesulfonate.

In still yet another embodiment, the photosensitive compound or photoacid generator includes alkylsulfonium salts. Examples of alkylsulfonium salts include cyclohexylmethyl (2-oxocyclohexyl) sulfonium trifluoromethanesulfonate; dicyclohexyl(2-oxocyclohexyl)sulfonium trifluoromethanesulfonate; cyclopentylmethyl(2-oxocyclohexyl)sulfonium trifluoromethanesulfonate; and cycloheptylmethyl(2-oxocyclopentyl)sulfonium trifluoromethanesulfonate.

Any suitable wavelength of radiation may be employed to expose portions of the organic semiconductor material. For example, radiation having wavelengths from about 1 nm to about 550 nm may be employed, including X-rays and electron beams (e-beams). Specific examples of actinic radiation includes wavelengths of 11 nm, 13 nm, 157 nm, 193 nm, 248 nm, 253 nm, 302 nm, 313 nm, 334 nm, 365 nm, 405 nm, 435 nm, 546 nm, X-rays, and e-beams.

When removing either the exposed or unexposed portion of the organic semiconductor material, a liquid or gas that solubilizes one of the exposed or unexposed portion (but not the other) is employed. Examples of such materials that can be employed to pattern or develop the organic semiconductor material layer include glycol ether esters, glycol ethers, furans, and alkyl alcohols containing from about 4 to about 7 carbon atoms, alkanes, other organic solvents, aqueous hydroxide solutions, aqueous acidic solutions, organic acidic solutions, organic basic solutions, and the like. Selection of an organic semiconductor material layer developer depends upon at least one of whether the exposed or unexposed portion is removed, the identity of the photosensitive compound, and the identity of the organic semiconductor material.

In one embodiment, the organic semiconductor layer contains a thin layer designed to improve or lengthen charge retention time. The thin layer may be disposed anywhere within the organic semiconductor layer, but typically near the middle of the layer. The thin layer contains any of the electrode materials or the compounds of the below-described heterocyclic/aromatic compound layer. In one embodiment, the thin layer has a thickness of about 50 Å or more and about 0.1 µm or less. In another embodiment, the thin layer has a thickness of about 100 Å or more and about 0.05 µm or less. For example, an organic memory cell may contain a first electrode of copper, a passive layer of copper sulfide, an organic semiconductor layer of poly(phenylene vinylene), and a second electrode of aluminum, wherein the poly(phenylene vinylene) organic semiconductor layer contains a 250 Å thick layer of copper therein.

In one embodiment, the organic semiconductor material does not contain an organometallic compound. In another embodiment, the organic semiconductor material contains an organic polymer doped with an organometallic compound.

In one embodiment, the organic semiconductor layer has a thickness of about 0.001 µm or more and about 5 µm or less. In another embodiment, the organic semiconductor layer has a thickness of about 0.01 µm or more and about 2.5 µm or less. In yet another embodiment, the organic semiconductor layer has a thickness of about 0.05 µm or more and about 1 µm or less.

The organic semiconductor layer may be formed by spin-on techniques (depositing a mixture of the polymer/polymer precursor, photosensitive compound, and a solvent, then removing the solvent from the substrate/electrode) or CVD techniques. During formation, the organic semiconductor material self assembles between the electrodes. The photosensitive compound is dispersed, typically in a substantially uniform manner, throughout the organic semiconductor material. It is not typically necessary to functionalize one or more ends of the organic polymer in order to attach it to an electrode/passive layer. When using spin-on techniques, the solvent in which the polymer/polymer precursor and photosensitive compound are charged before application to the wafer structure is able to solubilize the polymer/polymer precursor and photosensitive compound so that the organic semiconductor layer is formed in a substantially uniform manner over the surface of the substrate.

Solvents useful for this purpose include one or more of glycol ether esters, glycol ethers, furans, and alkyl alcohols containing from about 4 to about 7 carbon atoms. Two or more of glycol ether esters, glycol ethers, furans, and alkyl alcohols containing from about 4 to about 7 carbon atoms may be employed as a solvent system. The solvent system may contain one or more of glycol ether esters, glycol ethers, furans, and alkyl alcohols, and another organic solvent.

Examples of glycol ether esters include ethylene glycol methyl ether acetate, ethylene glycol ethyl ether acetate, ethylene glycol propyl ether acetate, ethylene glycol butyl ether acetate, propylene glycol methyl ether acetate, propylene glycol ethyl ether acetate, propylene glycol propyl ether acetate, propylene glycol butyl ether acetate, and the like.

Glycol ether esters also include polyalkylene glycol ether esters such as poly(ethylene glycol) alkyl ether acetates and poly(propylene glycol) alkyl ether acetates. Examples of poly(ethylene glycol) alkyl ether acetates and poly (propylene glycol) alkyl ether acetates include poly(ethylene glycol) methyl ether acetate, poly(ethylene glycol) ethyl ether acetate, poly(ethylene glycol) propyl ether acetate, poly(ethylene glycol) butyl ether acetate, poly(propylene glycol) methyl ether acetate, poly(propylene glycol) ethyl ether acetate, poly(propylene glycol) propyl ether acetate, and poly(propylene glycol) butyl ether acetate.

Additional specific examples of polyalkylene glycol ether esters include di(ethylene glycol) methyl ether acetate, di(ethylene glycol) ethyl ether acetate, di(ethylene glycol) propyl ether acetate, di(ethylene glycol) butyl ether acetate, di(ethylene glycol) hexyl ether acetate, di(ethylene glycol) dodecyl ether acetate, di(propylene glycol) methyl ether acetate, di(propylene glycol) ethyl ether acetate, di(propylene glycol) butyl ether acetate, tri(ethylene glycol) methyl ether acetate, tri(ethylene glycol) ethyl ether acetate, tri(ethylene glycol) butyl ether acetate, tri(propylene glycol) methyl ether acetate, tri(propylene glycol) butyl ether acetate, and the like.

Examples of glycol ethers include alkylene glycol ethers and polyalkylene glycol ethers, such as poly(ethylene glycol) methyl ether, poly(ethylene glycol) ethyl ether, poly (ethylene glycol) propyl ether, poly(ethylene glycol) butyl ether, poly(propylene glycol) methyl ether, poly(propylene glycol) ethyl ether, poly(propylene glycol) propyl ether, and poly(propylene glycol) butyl ether. Other examples of glycol ethers include ethylene glycol methyl ether, ethylene glycol methylbutyl ether, ethylene glycol ethylbutyl ether, ethylene glycol ethyl ether, ethylene glycol butyl ether, ethylene glycol dimethyl ether, ethylene glycol diethyl ether, ethylene glycol dibutyl ether, propylene glycol methyl ether, propylene glycol ethyl ether, propylene glycol butyl ether, propylene glycol dimethyl ether, propylene glycol diethyl ether, propylene glycol dibutyl ether, di(ethylene glycol) methyl ether, di(ethylene glycol) ethyl ether, di(ethylene glycol) butyl ether, di(ethylene glycol) hexyl ether, di(ethylene glycol) dimethyl ether, di(ethylene glycol) diethyl ether, di(ethylene glycol) dibutyl ether, di(ethylene glycol) butylmethyl ether, di(ethylene glycol) dodecyl ether, di(propylene glycol) methyl ether, di(propylene glycol) butyl ether, tri (ethylene glycol) methyl ether, tri(ethylene glycol) dimethyl ether, tri(propylene glycol) methyl ether, and tri(propylene glycol) butyl ether.

Furans include tetrahydrofuran. Alkyl alcohols containing from about 4 to about 7 carbon atoms specifically include alkyl alcohols containing from about 5 to about 6 carbon atoms. Examples of alkyl alcohols containing from about 4 to about 7 carbon atoms include n-butanol, iso-butanol, n-pentanol, iso-pentanol, cyclopentanol, n-hexanol, cyclohexanol, heptanol, and the like.

Using one or more of glycol ether esters, glycol ethers, furans, and alkyl alcohols containing from about 4 to about 7 carbon atoms, formation of the organic semiconductor layer is facilitated. In particular, forming the organic polymer in a direction away from the surface on which it is formed is facilitated, delivering the organic semiconductor material and the photosensitive compound to the substrate surface is facilitated, uniformly spaced organic polymer backbones are formed on the surface, and/or the formation of the organic semiconductor layer proceeds in a controllable manner.

In one embodiment, the mixture contains from about 0.1% to about 75% by weight of the organic semiconductor material and photosensitive compound and from about 25% to about 99.9% by weight of solvent (one or more of glycol ether esters, glycol ethers, furans, and alkyl alcohols). In another embodiment, the mixture contains from about 0.5% to about 50% by weight of the organic semiconductor material and photosensitive compound and from about 50% to about 99.5% by weight of solvent. In yet embodiment, the mixture contains from about 1% to about 25% by weight of the organic semiconductor material and photosensitive compound and from about 75% to about 99% by weight of solvent.

When applying the mixture of organic semiconductor material, photosensitive compound, and solvent to a wafer structure, the mixture is at a temperature suitable to facilitate formation of the organic semiconductor layer, facilitate solubilization of the organic semiconductor material and/or permit easy removal of the solvent from the wafer substrate. In one embodiment, the temperature of the mixture during application is from about 15° C. to about 80° C. In another embodiment, the temperature of the mixture during application is from about 25° C. to about 70° C. In yet another embodiment, the temperature of the mixture during application is from about 30° C. to about 60° C.

A covalent bond may be formed between the organic semiconductor material and the passive layer. Alternatively, close contact is required to provide good charge carrier/electron exchange between the organic semiconductor layer and the passive layer. The organic semiconductor layer and the passive layer are electrically coupled in that charge carrier/electron exchange occurs between the two layers.

A passive layer contains at least one conductivity facilitating compound that contributes to the controllably conductive properties of the controllably conductive media. The conductivity facilitating compound has the ability to donate and accept charges (holes and/or electrons). The passive layer thus may transport between an electrode and the organic polymer layer/passive layer interface, facilitate charge/carrier injection into the organic polymer layer, and/or increase the concentration of a charge carrier in the organic polymer layer. In some instances, the passive layer may store opposite charges thereby providing a balance of charges in the organic memory device as a whole. Storing charges/charge carriers is facilitated by the existence of two relatively stable oxidation states for the conductivity facilitating compound.

Generally, the conductivity facilitating compound or an atom in the conductivity facilitating compound has at least two relatively stable oxidation states. The two relatively stable oxidation states permit the conductivity facilitating compound to donate and accept charges and electrically interact with the organic semiconductor layer. The particular conductivity facilitating compound employed in a given organic memory cell is selected so that the two relatively stable oxidation states match with the two relatively stable oxidation states of the organic semiconductor material. Matching the energy bands of two relatively stable oxidation states of the organic semiconductor material and the conductivity facilitating compound facilitate charge carrier retention in the organic semiconductor layer.

Matching energy bands means that the fermi level of the passive layer is close to the valence band of the organic semiconductor layer. Consequently, the injected charge carrier (into the organic semiconductor layer) may recombine with the charge at the passive layer if the energy band of the charged organic semiconductor layer does not substantially change. Matching energy bands involves compromising between ease of charge injection and length of charge (data) retention time.

In one embodiment, when matching energy bands, the fermi level of the passive layer is within about 0.3 eV of the valence band of the organic semiconductor layer. In another embodiment, the fermi level of the passive layer is within about 0.25 eV of the valence band of the organic semiconductor layer. In yet another embodiment, the fermi level of the passive level is within about 0.2 eV of the valence band of the organic semiconductor layer. In still yet another embodiment, the fermi level of the passive layer is within about 0.15 eV of the valence band of the organic semiconductor layer.

The applied external field can reduce the energy barrier between passive layer and organic layer depending on the field direction. Therefore, enhanced charge injection in the forward direction field in programming operation and also enhanced charge recombination in reversed field in erase operation can be obtained.

The passive layer may in some instances act as a catalyst when forming the organic semiconductor layer, particularly when the organic semiconductor layer contains a conjugated organic polymer. In this connection, the polymer backbone of the conjugated organic polymer may initially form adjacent the passive layer, and grow or assemble away and substantially perpendicular to the passive layer surface. As a result, the polymer backbones of the conjugated organic polymers may be self aligned in a direction that traverses the two electrodes.

Examples of conductivity facilitating compounds that may make up the passive layer include one or more of copper sulfide ($Cu_2S$, $CuS$), copper rich copper sulfide ($Cu_3S/Cu_2S$, $Cu_3S/CuS$), copper oxide ($CuO$, $Cu_2O$), manganese oxide ($MnO_2$), titanium dioxide ($TiO_2$), indium oxide ($I_3O_4$), silver sulfide ($Ag_2S$, $AgS$), gold sulfide ($Au_2S$, $AuS$), iron oxide ($Fe_3O_4$), nickel arsenide ($NiAs$), cobalt arsenide ($CoAs_2$), and the like. The conductivity facilitating compounds do not dissociate into ions under the strength of the electric field. The passive layer may contain two or more sub-passive layers, each sub-layer containing the same, different, or multiple conductivity facilitating compounds.

The passive layer is grown using oxidation techniques, formed via gas phase reactions, or deposited between the electrodes. In some instances, to promote long charge retention times (in the organic semiconductor layer), the passive layer may be treated with a plasma after it is formed. The plasma treatment modifies the energy barrier of the passive layer.

In one embodiment, the passive layer containing the conductivity facilitating compound has a thickness of about 2 Å or more and about 0.1 $\mu$m or less. In another embodiment, the passive layer has a thickness of about 10 Å or more and about 0.01 $\mu$m or less. In yet another embodiment, the passive layer has a thickness of about 50 Å or more and about 0.005 $\mu$m or less.

In order to facilitate operation of the organic memory cells, the organic semiconductor layer is thicker than the passive layer. In one embodiment, the thickness of the organic semiconductor layer is from about 10 to about 500 times greater than the thickness of the passive layer. In another embodiment, the thickness of the organic semiconductor layer is from about 25 to about 250 times greater than the thickness of the passive layer.

The area size of the individual organic memory cells (as measured by the surface area of the two electrodes directly overlapping each other) can be small compared to conventional silicon based inorganic memory cells such as MOSFETs. In one embodiment, the area size of the organic memory cells of the present invention is about 0.0001 $\mu m^2$ or more and about 4 $\mu m^2$ or less. In another embodiment, the area size of the organic memory cells is about 0.001 $\mu m^2$ or more and about 1 $\mu m^2$ or less.

Referring to FIGS. 2 to 8, an exemplary method of making the organic memory elements/cells using a patternable organic semiconductor layer is shown.

Figure 2:
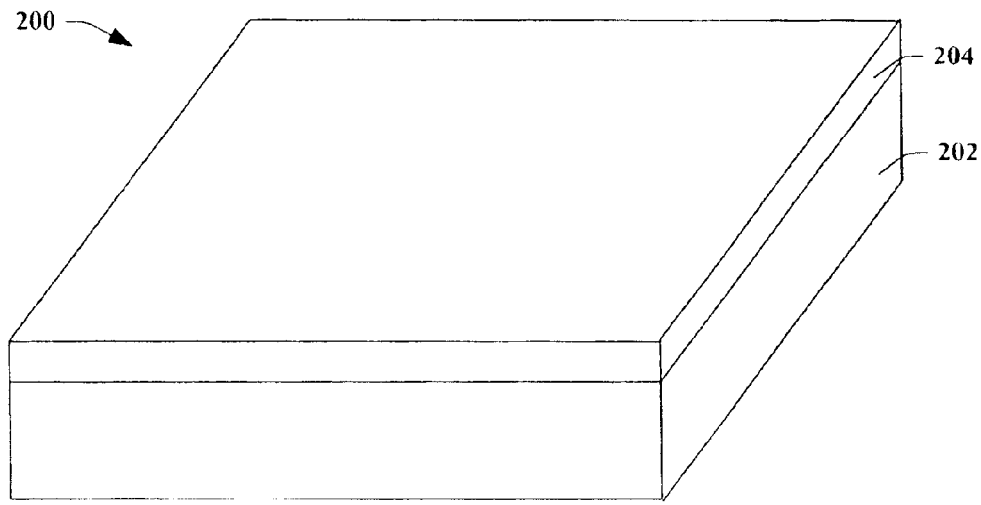
FIG. 2 illustrates a cross-sectional view of a method of making organic memory cells in accordance with one aspect of the invention.

Specifically referring to FIG. 2, a structure 200 including a substrate 202 has a conductive metal layer 204 formed thereover. The conductive metal layer 204 contains copper, although any of the previously mentioned electrode materials can be employed.

Figure 3:
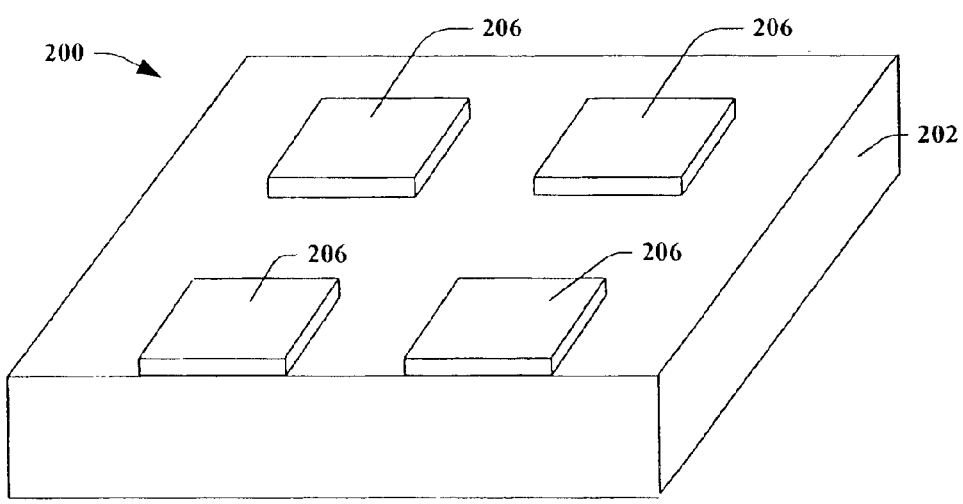
FIG. 3 illustrates a cross-sectional view of a method of making organic memory cells in accordance with one aspect of the invention.

Referring to FIG. 3, the conductive metal layer 204 is patterned to form electrode pads 206 using photolithographic techniques. Alternatively, although not shown, a dielectric layer can be formed, and openings (corresponding to the subsequently formed conductive metal pads) formed therein. Then a metal can be deposited over the substrate, followed by a subtractive process (CMP or etching) where metal not located within the openings is removed from the structure. At any rate, conductive metal pads 206 are provided on a substrate 202. Optionally, the conductive metal pads 206 may be oxidized to form a thin passive layer (not shown), containing for example copper sulfide, over the upper portion of the pads 206.

Figure 4:
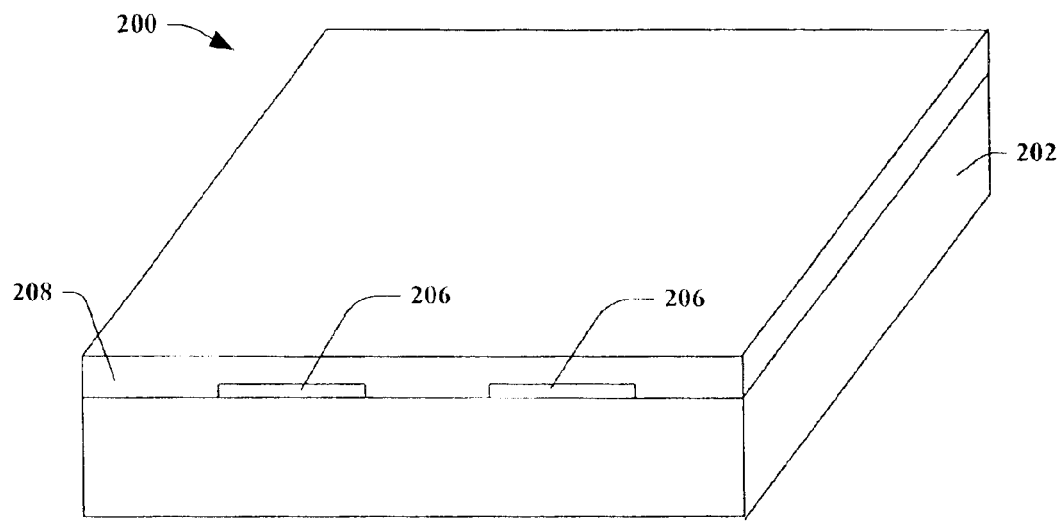
FIG. 4 illustrates a cross-sectional view of a method of making organic memory cells in accordance with one aspect of the invention.

Referring to FIG. 4, an organic semiconductor layer 208 is formed over the substrate 202 having conductive metal pads 206 thereon. The organic semiconductor layer 208 contains an organic semiconductor material (such as a conductive polymer) and a photosensitive compound, such as a photoacid generator. The organic semiconductor layer 208 formed over the entire substrate where the conductive metal pads 206 are located.

Figure 5:
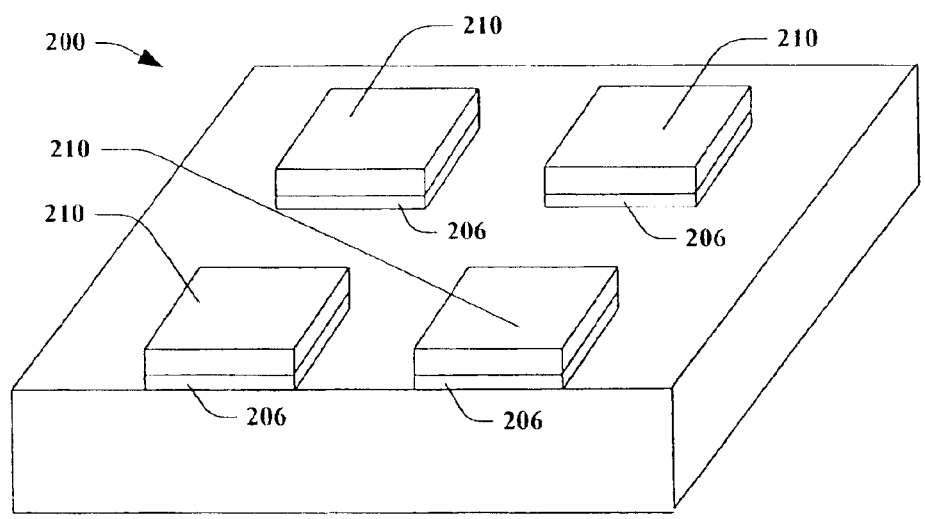
FIG. 5 illustrates a cross-sectional view of a method of making organic memory cells in accordance with one aspect of the invention.

Referring to FIG. 5, owing to the presence of the photosensitive compound, the organic semiconductor layer 208 is patterned so that structures 210 are formed that generally correspond to conductive metal pads 206. The organic semiconductor layer 208 is patterned using photolithography techniques. For example, portions the organic semiconductor layer can be exposed to actinic radiation, optionally using a patterned photoresist as a mask, to provide an organic semiconductor layer having exposed and unexposed portions. In the exposed portions, chemical changes take place due to the presence of the photosensitive compound. The chemical changes result in differing solubilities for the exposed and unexposed portions of organic semiconductor layer. Exploiting the differing solubilities, either the exposed or unexposed portion is removed from the structure by contacting the structure with an appropriate solvent/gas. In this manner, the organic semiconductor layer 208 is developed into organic semiconductor structures 210.

Figure 6:
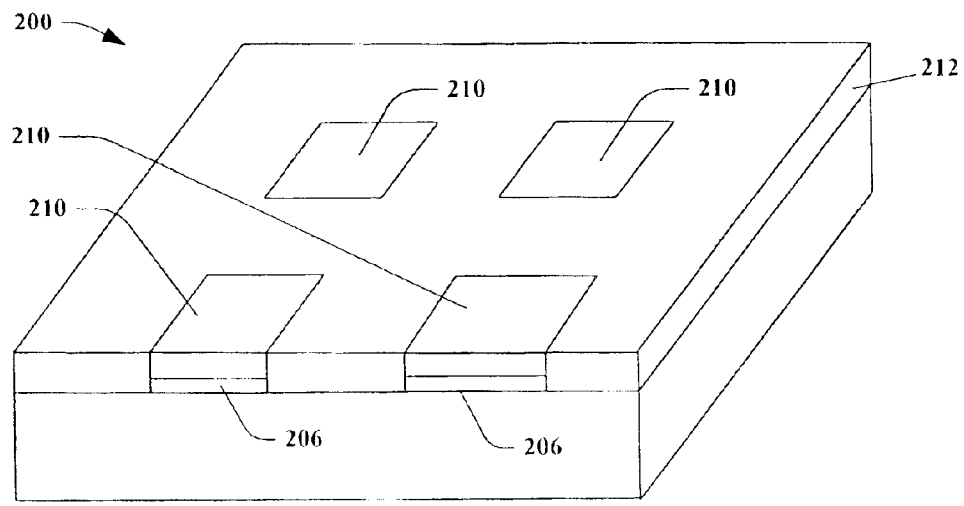
FIG. 6 illustrates a cross-sectional view of a method of making organic memory cells in accordance with one aspect of the invention.

Referring to FIG. 6, a dielectric material 212 can be formed on the structure 200 to provide electrical insulation between subsequently formed organic memory cells. The dielectric material 212 can contain any suitable low dielectric constant material such as silicon dioxide, silicon nitride, silicon oxynitride, low K materials, and the like.

Figure 7:
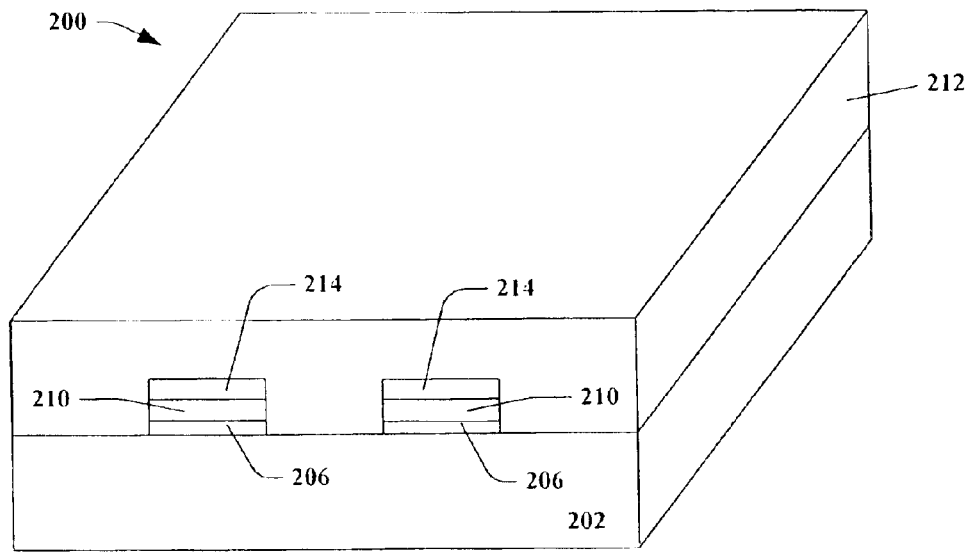
FIG. 7 illustrates a cross-sectional view of a method of making organic memory cells in accordance with one aspect of the invention.

Referring to FIG. 7, formation of the organic memory cells is completed by forming conductive metal structures 214 over the organic semiconductor structures 210. This can be done in a variety of ways, including forming a conductive metal layer over the structure 200, patterning the metal layer to correspond with the organic semiconductor structures 210, and forming additional dielectric material 212 over the structure; or forming additional dielectric material 212 over the structure, providing openings in the additional dielectric material 212 over the organic semiconductor structures 210, forming a conductive metal layer in the opening, and adding further dielectric material to structure 200.

Operation of the organic memory devices/cells is facilitated using an external stimuli to achieve a switching effect. The external stimuli include an external electric field and/or light radiation. Under various conditions, the organic memory cell is either conductive (low impedance or "on" state) or non-conductive (high impedance or "off" state).

The organic memory cell may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information.

Switching the organic memory cell to the "on" state from the "off" state occurs when an external stimuli such as an applied electric field exceeds a threshold value. Switching the organic memory cell to the "off" state from the "on" state occurs when an external stimuli does not exceed a threshold value or does not exist. The threshold value varies depending upon a number of factor including the identity of the materials that constitute the organic memory cell and the passive layer, the thickness of the various layers, and the like.

Generally speaking, the presence of an external stimuli such as an applied electric field that exceeds a threshold value ("on" state) permits an applied voltage to write or erase information into/from the organic memory cell and the presence of an external stimuli such as an applied electric field that is less than a threshold value permits an applied voltage to read information from the organic memory cell; whereas the absence of the external stimuli that exceeds a threshold value ("off" state) prevents an applied voltage to write or erase information into/from the organic memory cell.

To write information into the organic memory cell, a voltage or pulse signal that exceeds the threshold is applied. To read information written into the organic memory cell, a voltage or electric field of any polarity is applied. Measuring the impedance determines whether the organic memory cell is in a low impedance state or a high impedance state (and thus whether it is "on" or "off"). To erase information written into the organic memory cell, a negative voltage or a polarity opposite the polarity of the writing signal that exceeds a threshold value is applied.

The organic memory devices described herein can be employed to form logic devices such as central processing units (CPUs); volatile memory devices such as DRAM devices, SRAM devices, and the like; input/output devices (I/O chips); and non-volatile memory devices such as EEPROMs, EPROMs, PROMs, and the like. The organic memory devices may be fabricated in planar orientation (two dimensional) or three dimensional orientation containing at least two planar arrays of the organic memory cells.

Figure 8:
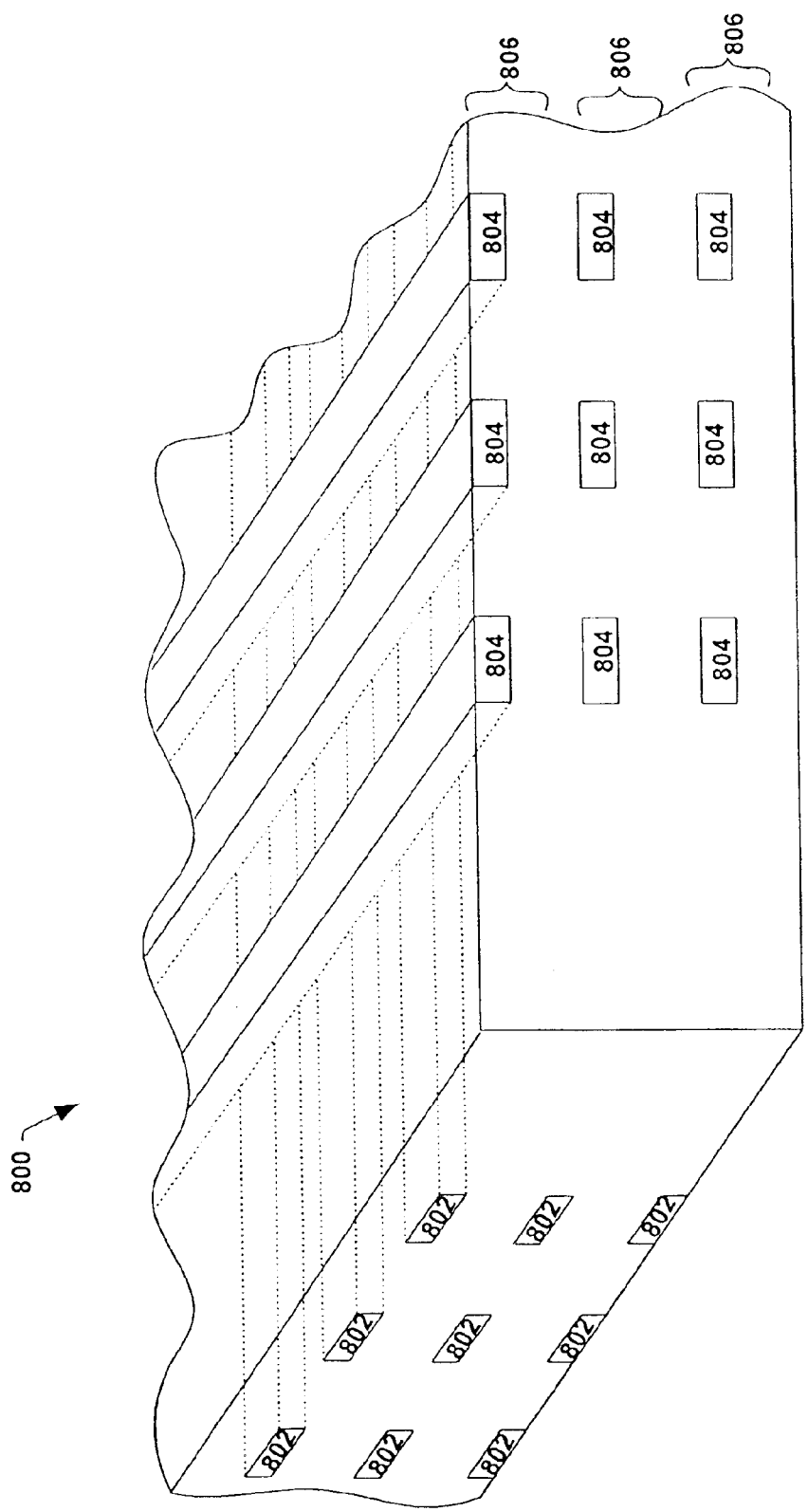
FIG. 8 illustrates a perspective view of a three dimensional microelectronic device containing a plurality of organic memory cells in accordance with another aspect of the invention.

Referring to FIG. 8, a three dimensional microelectronic organic memory device 800 containing a plurality of organic memory cells in accordance with an aspect of the invention is shown. The three dimensional microelectronic organic memory device 800 contains a plurality of first electrodes 802, a plurality of second electrodes 804, and a plurality of memory cell layers 806. Between the respective first and second electrodes are the controllably conductive media (not shown). The plurality of first electrodes 802 and the plurality of second electrodes 804 are shown in substantially perpendicular orientation, although other orientations are possible. The three dimensional microelectronic organic memory device is capable of containing an extremely high number of memory cells thereby improving device density. Peripheral circuitry and devices are not shown for brevity.

The organic memory cells/devices are useful in any device requiring memory. For example, the organic memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, palm pilots, pagers, notebook computers, remote controls, recorders (video and audio), radios, small televisions and web viewers, cameras, and the like.

Although the invention has been shown and described with respect to a certain embodiments, equivalent alterations and modifications will occur to others skilled in the art upon the reading and understanding of this specification and the annexed drawings. In regard to the various functions performed by the above described components (assemblies, devices, etc.), the terms used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An organic memory cell, comprising:
   at least two electrodes;
   a passive layer comprising a conductivity facilitating compound adjacent to one of the electrodes; and
   an organic semiconductor layer positioned between the two electrodes, the organic semiconductor layer comprising from about 75% to about 99.99% by weight of at least one of a conjugated organic polymer, a conjugated organometallic polymer, a buckyball, and a carbon nanotube and from about 0.01% to about 25% by weight of at least one photosensitive compound.

2. The organic memory cell of claim 1, wherein the organic semiconductor layer comprising from about 90% to about 99.5% by weight of at least one of a conjugated organic polymer, a conjugated organometallic polymer, a buckyball, and a carbon nanotube and from about 0.5% to about 10% by weight of at least one photosensitive compound.

3. The organic memory cell of claim 1, wherein the photosensitive compound comprises at least one selected from the group consisting of aromatic substituted halohydrocarbons, halo-substituted sulfur containing compounds, haloheterocyclic compounds, azides, triazines, sulfonated esters, sulfonated ketones, halonium salts, quarternary ammonium salts, phosphonium salts, arsonium salts, aromatic sulfonium salts, aryl sulfonium salts, alkyl sulfonium salts, and sulfoxonium salts or seleonium salts and alkylsulfonium salts.

4. The organic memory cell of claim 1, wherein the organic semiconductor layer has a thickness of about 0.001 $\mu$m or more and abut 5 $\mu$m or less and the passive layer has a thickness of about 2 Å or more and about 0.1 $\mu$m or less.

5. The organic memory cell of claim 1, wherein the conductivity facilitating compound comprises at least one selected from the group consisting of copper sulfide, copper oxide, manganese oxide, titanium dioxide, indium oxide, silver sulfide, gold sulfide, nickel arsenide, cobalt arsenide, and iron oxide.

6. The organic memory cell of claim 1, wherein the first electrode and the second electrode independently comprise at least one selected from the group consisting of aluminum, chromium, copper, germanium, gold, magnesium, manganese, indium, iron, nickel, palladium, platinum, silver, titanium, zinc, and alloys thereof; indium-tin oxide; polysilicon; doped amorphous silicon; and metal silicides.

7. The organic memory cell of claim 1, wherein the organic semiconductor layer comprises at least one conjugated organic polymer selected from the group consisting of polyacetylene; polyphenylacetylene; polydiphenylacetylene; polyaniline; poly(p-phenylene vinylene); polythiophene; polyporphyrins; porphyrinic macrocycles, thiol derivatized polyporphyrins; polymetallocenes, polyphthalocyanines; polyvinylenes; and polystiroles.

8. An organic memory cell, comprising:
   at least two electrodes;
   a passive layer comprising a conductivity facilitating compound adjacent to one of the electrodes; and
   an organic semiconductor layer positioned between the two electrodes, the organic semiconductor layer comprising from about 85% to about 99.9% by weight of at least one of a conjugated organic polymer, a conjugated organometallic polymer, a buckyball, and a carbon nanotube and from about 0.1% to about 15% by weight of at least one photosensitive compound.

9. The organic memory cell of claim 8, wherein the organic semiconductor layer has a thickness of about 0.001 $\mu$m or more and about 5 $\mu$m or less and the passive layer has a thickness of about 2 Å or more and about 0.1 $\mu$m or less.

10. The organic memory cell of claim 8, wherein at least one of the electrodes comprises copper.

11. The organic memory cell of claim 8, wherein the photosensitive compound comprises at least one selected from the group consisting of aromatic substituted halohydrocarbons, halo-substituted sulfur containing compounds, haloheterocyclic compounds, azides, triazines, sulfonated esters, sulfonated ketones, halonium salts, quarternary ammonium salts, phosphonium salts, arsonium salts, aromatic sulfonium salts, aryl sulfonium salts, alkyl sulfonium salts, sulfoxonium salts, seleonium salts, and alkylsulfonium salts.

12. The organic memory cell of claim 8, wherein the conductivity facilitating compound comprises at least one selected from the group consisting of copper sulfide, manganese oxide, silver sulfide, gold sulfide, nickel arsenide, and cobalt arsenide.

13. The organic memory cell of claim 8, wherein the first electrode and the second electrode independently comprise at least one selected from the group consisting of aluminum, copper, germanium, gold, indium, nickel, palladium, platinum, silver, and titanium.

14. The organic memory cell of claim 8, wherein the organic semiconductor layer comprises a conjugated organic polymer.

15. The organic memory cell of claim 8, wherein the organic semiconductor layer comprises a carbon nanotube.

16. An organic memory cell, comprising:
   at least two electrodes;
   a passive layer comprising a conductivity facilitating compound adjacent to one of the electrodes; and
   an organic semiconductor layer positioned between the two electrodes, the organic semiconductor layer comprising from about 75% to about 99.99% by weight of a conjugated organic polymer and from about 0.01% to about 25% by weight of at least one photosensitive compound.

17. The organic memory cell of claim 16, wherein the organic semiconductor layer comprises at least one conjugated organic polymer selected from the group consisting of polyacetylene; polyphenylacetylene; polydiphenylacetylene; polyaniline; poly(p-phenylene vinylene); polythiophene; polyvinylenes; and polystiroles.

18. The organic memory cell of claim 16, wherein the photosensitive compound comprises at least one selected from the group consisting of aromatic substituted halohydrocarbons, halo-substituted sulfur containing compounds, haloheterocyclic compounds, azides, triazines, sulfonated esters, sulfonated ketones, halonium salts, seleonium salts and alkylsulfonium salts.

19. The organic memory cell of claim 16, wherein the photosensitive compound comprises at least one selected from the group consisting of quaternary ammonium salts, phosphonium salts, arsonium salts, aromatic sulfonium salts, aryl sulfonium salts, alkyl sulfonium salts, and sulfoxonium salts.

20. The organic memory cell of claim 16, wherein the organic semiconductor layer comprises from about 90% to about 99.5% by weight of a conjugated organic polymer and from about 0.5% to about 10% by weight of at least one photosensitive compound.

* * * * *